United States Patent [19]

Heinen et al.

[11] Patent Number: 4,768,199

[45] Date of Patent: Aug. 30, 1988

[54] MECHANISM FOR SELF-ADJUSTING POSITIONING OF A SEMICONDUCTOR LASER RELATIVE TO AN OPTICAL FIBER TO BE COUPLED THERETO

[75] Inventors: Jochen Heinen, Haar; Friedrich Weidinger, Taufkirchen, both of Fed. Rep. of Germany

[73] Assignee: Siemens Aktiengesellschaft, Berlin and Munich, Fed. Rep. of Germany

[21] Appl. No.: 904,191

[22] Filed: Sep. 5, 1986

[30] Foreign Application Priority Data

Sep. 5, 1985 [DE] Fed. Rep. of Germany ....... 3531734

[51] Int. Cl.[4] .............................................. H01S 3/19
[52] U.S. Cl. ..................... 372/36; 350/96.2; 372/44
[58] Field of Search .................... 372/36, 44; 350/96.2

[56] References Cited

U.S. PATENT DOCUMENTS

| | | | |
|---|---|---|---|
| 4,161,701 | 7/1979 | Takeda et al. | 372/36 |
| 4,352,187 | 9/1982 | Amann | 372/46 |
| 4,411,057 | 10/1983 | Duda et al. | 29/569 L |
| 4,466,696 | 8/1984 | Carney | 350/96.20 |
| 4,603,419 | 7/1986 | Shimizu et al. | 372/36 |

FOREIGN PATENT DOCUMENTS

| | | | |
|---|---|---|---|
| 0006042 | 12/1979 | European Pat. Off. | |
| 3307669 | 9/1984 | Fed. Rep. of Germany | 372/36 |
| 3330392 | 3/1985 | Fed. Rep. of Germany | |
| 2426271 | 12/1979 | France | |
| 0003391 | 1/1977 | Japan | 372/36 |
| 0014181 | 2/1979 | Japan | 372/36 |

OTHER PUBLICATIONS

L. D. Comerford, "Etched Silicon Structure for Aligning a Photodiode and Optical Fiber", IBM TDB vol. 22 No. 7, Dec. 1979, pp. 2935–2936.
L. Balliet et al, "Method of Aligning Optical FIbers . . . " *IBM TDB* vol. 25 No. 4, Sep. 1982, pp. 2188–2189.
L. Balliet et al. "Self-Aligning Edge Emitter for Fiber Optics" *IBM Technical Disclosure Bulletin*, v 23, #7B, (Dec. 1980) 3104 3106.
R. Goodfellow et al. "GaInAsP/InP Fast, High-Radiance, 1.05 . . . " *IEEE Trans. on Electron Devices*, v ED-26, #8 (Aug. 1979) 1215 1220.
K. Y. Liou et al. "Single-Longitudinal-Mode Stabilized Graded . . . " *Appl. Phys. Lett.*, 45 (7) (1 Oct. 1984) pp. 729–731.

*Primary Examiner*—James W. Davie
*Attorney, Agent, or Firm*—Hill, Van Santen, Steadman & Simpson

[57] ABSTRACT

A mechanism for self-adjusting positioning of a glass fiber to a semiconductor laser chip includes an adjustment member with a groove into which a mesa ridge of the laser chip is secured and into which the glass fiber is placed.

6 Claims, 2 Drawing Sheets

4,768,199

MECHANISM FOR SELF-ADJUSTING POSITIONING OF A SEMICONDUCTOR LASER RELATIVE TO AN OPTICAL FIBER TO BE COUPLED THERETO

BACKGROUND OF THE INVENTION

1. Field of the Invention

The present invention relates to a mechanism for positioning a glass fiber relative to a semiconductor laser.

2. Description of the Prior Art

Both glass fiber lines and semiconductor elements that generate optical emissions are used for communications-oriented transmissions. In particular, the semiconductor elements commonly used are laser diodes. The known laser diodes generate a relatively highly focused radiation and have a comparatively small radiation emitting face on the semiconductor body from which the laser emission is generated. The area of laser emission, commonly referred to as a diameter, has the dimensions of a few μm.

Since the glass fiber used for optical transmissions has an effective propagating cross-section of a comparable dimension, considerable expense is required to provide an adequately precise adjustment between the glass fiber line and the laser diode. A good coupling of the laser emission into the glass fiber can only be guaranteed for adjustment tolerances of a few μm.

In U.S. Pat. No. 4,411,057, which corresponds to European patent application No. 0,006,042, is disclosed an adjustment device which has an adjustment member of a material which is deformable with an extrusion die. A V-shaped groove is impressed for the glass-fiber and a planar depression is impressed for the laser diode. The side walls of the planar depression have such a great distance from one another that the laser diode can be attached in this depression laterally displaceable by a considerable amount.

In U.S. Pat. No. 4,466,696 is disclosed an adjustment device having a V-shaped groove for accepting a glass fiber which is etched into the substrate member of a laser diode. Since the V-shaped groove is situated in the body of the laser diode, once the position is established, it is permanently fixed. The etching of the V-shaped groove and the complicated technological manufacture of the laser diode with epitaxial steps and the like, however, these steps are executed on a single member, which has a substantially complicating effect on the overall manufacturing process due to the different measures which must be executed in chronological succession.

An adjustment having two abutting members is disclosed in Applied Phys. Lett., Vol. 45 (1984), pages 729–731, and in particular, in FIG. 1. A first of the two abutting members carries the laser diode. The second member abutting the first member forms a transversely proceeding rectangular depression together with the first member which receives a capillary tube.

In the publication IBM Technical Disclosure Bulletin, Vol. 23 (1980), pages 3104 through 3106, and in particular, at FIGS. 1 and 2, a semiconductor member having a V-shaped groove, into which a glass fiber is inserted, is shown. The laser diode forms a part of this semiconductor member. A channel that has slanting edges is formed in the surface of the member and is a component part of the actual diode function. At an upper side of the member lying between the slanting edges is a metal diode which is on the semiconductor material of the laser diode and recessed in the channel. There is no further member in the channel which can be used to adjust the channel in any way.

The German Patent No. OS 33 30 992 discloses a cooling member provided with a V-shaped groove. A laser diode soldered to the cooling member can be used to adjust the laser diode on the cooling member. The principal function of the groove is to keep the laser diode which is soldered to the cooling member free of disturbing mechanical stresses which would otherwise be exerted on the laser diode by the cooling member. The groove in the cooling member cannot be used to adjust a coupled glass fiber.

SUMMARY OF THE PRESENT INVENTION

An object of the present invention is to provide a self-adjusting means for positioning a semiconductor laser relative to a glass fiber. A further object of the invention is to provide such relative positioning without detrimental effects on the adjustment by temperature changes. These and other objects are embodied in a laser chip having a mesa structure and an adjustment member with a V-shaped groove into which the mesa structure is secured along with a glass fiber.

Firstly, a principle of the present invention is to provide a shape and a material for an adjustment member which has specific properties that are suitable for generating surfaces capable of being used for exact positionings. A semiconductor material in the form of a crystal is used for the adjustment member for this reason. By selective etching, positioning surfaces which are oriented along crystal faces are generated in the adjustment member. For example, silicon, and preferably a single silicon crystal, is used for this purpose.

In accordance with the present invention, a V-shaped groove is produced in the adjustment member of semiconductor material by masking and selective etching. For example, a V-groove is etched into a silicon crystal having a 100-oriented surface. The lateral faces of the V-groove are, thus, formed by the 111-surfaces of the crystal. The two 111-surfaces are oriented relative to one another to form an exact angle $\beta$ of 70.52°, without requiring special technological outlay. The angle $\beta$ is well suited for accepting a glass fiber in the formed V-shaped groove and between the lateral 111 faces. The depth of the V-groove and the prescribed diameter of the glass fiber are of such relative dimensions that when the glass fiber is laid in the groove, it has an exact x-y position of the fiber core, which is crucial for coupling.

In addition thereto, measures are provided with which the semiconductor chip of the semiconductor laser can be positioned relative to the V-groove. Two alternatives are provided for realizing this principle. Semiconductor lasers can be constructed such that the laser chip and his substrate member have a ridge formed of epitaxial layers multiply applied one over another. The ridge includes faces residing obliquely relative to one another and accomodates a favorable realization of the geometrical shape of a semiconductor laser.

A laser chip is shown in FIG. 1 of U.S. Pat. No. 4,352,187 which includes a mesa ridge. For example, when the laser chip has a 100-surface, then the 111-surface edges of the mesa ridge are easily manufactured. For the known laser diodes, a mesa ridge has an optimal height of between 5 and 50 μm. The base width of the mesa ridge can be very exactly set by means of a photoresist technique and can also be identical to the full width of the chip without requiring any special technology and by using the known epitaxy manufacturing processes for laser chips.

One of the alternatives addressed is that the mesa ridge is the active mesa ridge of the laser diode for the aforementioned U.S. patent. A second alternative is to provide a mesa ridge within which the active mesa ridge is disposed, the ridge being broader than the ridge of the first alternative. The active mesa ridge then is laterally limited by two V-shaped notches.

In the present state of technology, it is no problem to manufacture laser chips having a laser active zone with a position dimension relative to the mesa ridge which is exactly defined. The laser active zone for such lasers is defined as the cross-sectional surface lying at the semiconductor layer from which the laser emission emerges. The mesa ridge can be applied to either the upperside or the underside of the substrate. As a consequence of the photo-technique means, the laser strip is disposed exactly in the center of the mesa ridge. Thus, the x and y position of the laser active zone is exactly determined relative to the substrate surface of the chip. Since, as set forth above, the x-y position of the core of the glass fiber laid in the V-groove is exactly determined by adapting the appropriate dimensions thereof, the glass fiber and the laser diode can be positioned with extraordinary precision relative to one another. The core of the glass fiber is positioned with respect to the laser active zone of the laser diode in the x direction and the y direction in a self-adjusting fashion. The position of the chip and laser diode in the z direction is not critical per se and can be set by manipulation at relative distances ranging from 5 to 30 $\mu$m apart before the fiber and laser chip are firmly and permanently joined in the V-groove to the substrate member.

It is advantageous during this final fastening step to provide the juxtaposed surfaces of the laser chip and the V-groove with metal layers. It is also preferred to apply the laser chip in place on the adjustment member at the V-groove by shaking so as to obtain a faultless abutment, and further, to solder the adjustment member and the laser chip to one another. Another alternative is to provide a mesa ridge on the laser chip lying opposite the laser active mesa ridge.

DESCRIPTION OF THE PREFERRED EMBODIMENTS

Figure 1:
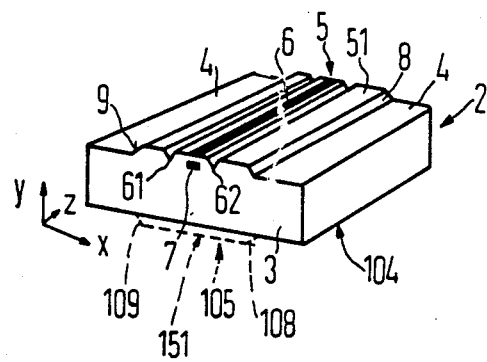
FIG. 1 is a perspective view of a laser chip according to the principles of the present invention and having a mesa ridge provided with V-shaped notches.

Referring firstly to FIG. 1, a laser chip 2 is provided formed essentially of a semiconductor substrate member 3, on an upper surface 4 of which is a mesa ridge 5. The mesa ridge 5 is unitary with the substrate member 3 and is formed of a plurality of epitaxially applied layers lying one over another. A strip-shaped electrode 6 extends along a surface 51 of the mesa ridge 5. In the x direction, as shown by the coordinate markings, a laser active zone 7 is established by the position of the electrode strip 6, only the exit of the laser active zone 7 being shown at the cross-sectional end face of the surface chip 2. The epitaxial layer structure determines the position of the laser active zone 7 in the y direction. Additional details of the laser diode structure are known, for example, from the aforementioned U.S. patent, and as such no additional details are provided herein.

It is important to the invention that first and second lateral, or side, surfaces 8 and 9 of the mesa ridge 5 lie at a prescribable angle relative to the surface 4. This angle is achieved by mechanical etching with potassium dichromate dissolved in sulfuric acid and hydrochloric acid.

For the first alternate embodiment, the mesa ridge 5 is the laser active ridge, as disclosed in U.S. Pat. No. 4,352,187. In accordance with a second alternate embodiment, however, the mesa ridge 5 has a comparatively greater width and includes two V-shaped notches 61 and 62. The notches extend parallel to the laser active zone and extend into the surface of the mesa ridge at least to the depth of the laser active zone. An advantage of the second embodiment is that potential mechanical stresses that arise have less effect on the laser active mesa ridge present between the notches 61 and 62.

Figure 2:
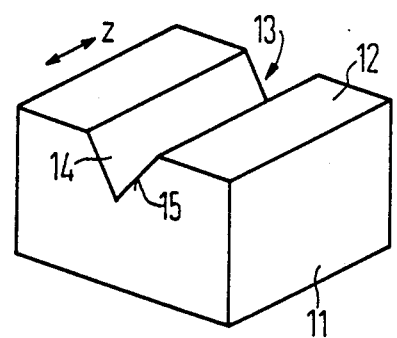
FIG. 2 is a perspective view of an adjustment member also according to the principles of the present invention and including a V-groove.

With reference to FIG. 2, a semiconductor member 11 is provided and may be of silicon, gallium arsenide, or the like. Cubically crystallized semiconductor materials are preferred for the semiconductor member 11. For the illustrated embodiment, the semiconductor body 11 is oriented so that a surface 12 thereof is formed by a 100-crystal face. By etching the adjustment member 11 at the surface 12, a groove 13 is formed into the surface 12 by use of appropriate masking. Side faces 14 and 15 of the groove 13 form on the basis of the selected crystal orientation, the side faces 14 and 15 being formed by 111-crystal faces to generate the V-groove 13. Due to the crystalline structure, the faces 14 and 15 have an exact angular orientation in the semiconductor member 11.

Figure 3:
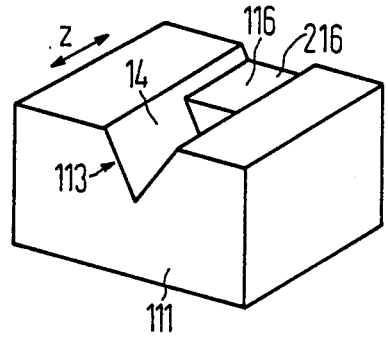
FIG. 3 is a perspective view of another embodiment of an adjustment member of the invention.

In an alternate embodiment shown in FIG. 3, a semiconductor member 111 has a groove 113. In comparison to the adjustment member 11 of FIG. 2, a portion 116 remains in the groove 113 and has an upper surface 216. The portion 116 is easily generated by interrupting the etching process and providing an intermediate masking.

Figure 4:
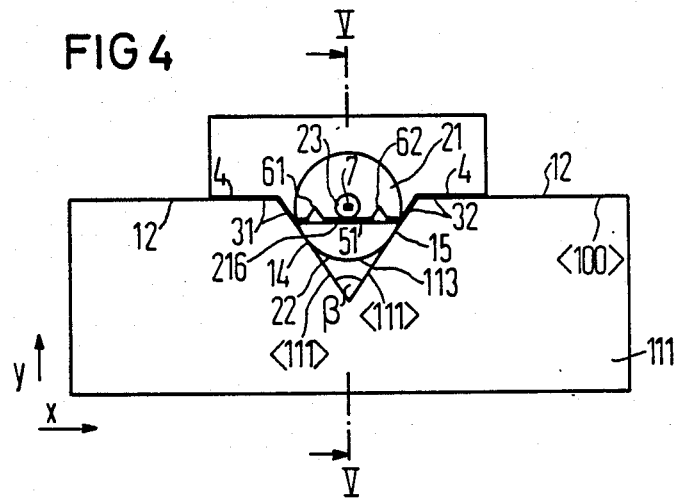
FIG. 4 is a front elevational view of the assembled arrangement for positioning a laser chip relative to a glass fiber according to the present invention.

In FIG. 4, the assembled positioning mechanism is shown having referenced characters coinciding with those of FIGS. 1 through 3, the embodiment of FIG. 4 being formed with the adjustment member 111 of FIG. 3. The adjustment member 111 is shown with the V-groove 113 extending along the z-axis perpendicular to the plane of the illustration. The laser chip 2 is inverted on the adjustment member 111, relative to the position shown in FIG. 1. The chip surface 4 and the surface 12 of the adjustment member 111 abut one another, preferably tightly. In any case, the lateral faces 8 and 9 of the mesa ridge 5 lie tightly against side faces 14 and 15 of the V-groove 113. It is the adjacency of the faces 8 and 9, and 14 and 15, which effects the exact positioning of the laser chip 2 on the adjustment member 111. Although FIG. 4 is shown using the adjustment member 111, it is also possible to use the adjustment member 11 of FIG. 2 in place thereof.

A glass fiber 21 (shown in cross-section) lies in the groove 113. An outer surface 22 of the glass fiber 21 rests tightly against the side faces 14 and 15 of the V-groove 113. The glass fiber 21 has a fiber core 23 along which light transmission occurs.

The fiber core 23 and the laser active zone 7 are adjusted relative to one another with extreme precision, the relative positions being self-adjusting. An exact self-adjustment position is guaranteed by the crystal orientation of the side faces 14 and 15 and of the side faces 8 and 9 of the mesa ridge 5, as well as by the diameter of the glass fiber 21, which is known exactly. Soldering occurs at the locations 31 and 32 along the adjacent faces of the laser chip 2 and the semiconductor adjustment member 111. When the width of the mesa ridge 5 is identical to the width of the laser chip 2, then soldering can be performed at the surface 216 of the portion 116. The surface 51 of the mesa ridge 5, in some embodiments, lies against surface 216 of the portion 116. For such arrangement, good heat dissipation is realized from the laser chip 2 through the part 116 and into the semiconductor member 111.

Figure 5:
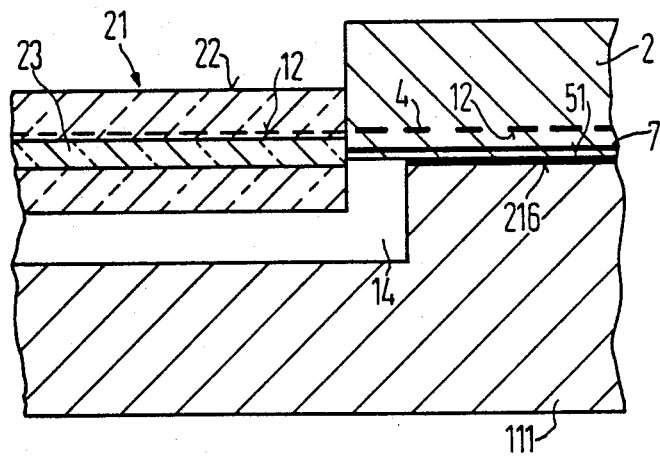
FIG. 5 is a lateral cross-section along lines V—V of the arrangement shown in FIG. 4.

In the cross-section of FIG. 5, the laser chip 2 rests on the surface 216 so that the laser active zone 7 is coincident with the core 23 of the glass fiber 21. The glass fiber 21 is supported by the lateral sides 14 and 15 of the groove 113 so that an exact relative position between the core 23 and the laser active zone 7 is maintained.

A third alternate embodiment for the present invention is shown by broken lines in FIG. 1. A mesa ridge 105 having sides 108 and 109 and a top surface 151 is provided at a lower surface 104 of the laser chip 2. The mesa ridge 105 lies opposite the laser active zone 7. For this embodiment, the mesa ridge 105 is inserted and fitted into the groove 13, or 113, of the adjustment member 11, or 111, respectively. To provide the exact relative positioning of the glass fiber 21, the diameter of the fiber 21 and/or the dimensions of the V-groove 13, or 113, is adapted to the position of the laser active zone 7. This embodiment has the advantage that no mechanical stresses can influence the laser active zone 7.

Although modifications and changes may be suggested by those skilled in the art, it is the intention of the inventors to embody within the patent warranted hereon all changes and modifications as reasonably and properly come within the scope of their contribution to the art.

We claim as our invention:

1. A mechanism for coupling a glass fiber having a core to a semiconductor laser, comprising:
    a laser chip of a semiconductor material having a cubic crystal lattice structure, said laser chip being provided with a laser active zone and a semiconductor substrate member,
        said substrate member including a mesa ridge at a first surface,
        said mesa ridge having first and second etched lateral surfaces slanted with respect to said first surface;
    an adjustment member of a semiconductor material having a cubic crystal lattice structure and a V-shaped groove in a first surface, lateral surfaces of said V-shaped groove being etched surfaces;
    said mesa ridge of said laser chip being fitted into and secured to said groove of said adjustment member, said etched lateral surfaces of said mesa ridge being joined to said etched lateral surfaces of said V-shaped groove;
    said V-shaped groove having a width and having side angles such that the core of said glass fiber is precisely positioned relative to the laser active zone of said laser chip; and
    said glass fiber being received in said V-shaped groove with said core in registration with said laser active zone of said laser chip.

2. A mechanism as claimed in claim 1, wherein said laser chip is soldered to said adjustment member.

3. A mechanism as claimed in claim 1, further comprising:
    a first portion of said adjustment member disposed in said V-shaped groove, said laser chip being secured to said first portion.

4. A mechanism as claimed in claim 1, wherein said mesa ridge of said laser chip includes notches extending parallel to said laser active zone in a surface of said mesa ridge, said notches extending into said laser chip at least to the depth of said laser active zone.

5. A mechanism as claimed in claim 1, wherein said mesa ridge is provided on a surface of said semiconductor substrate member opposite said laser active zone of said laser chip, said mesa ridge being fastened to said adjustment member to position said laser active zone relative to said core of said glass fiber.

6. An apparatus for positioning a laser diode relative to a light transmitting fiber, the laser diode including a laser active region within a mesa structure having etched surfaces defined by crystal faces of a cubically crystallized semiconductor material, the light transmitting fiber having a light transmitting core, comprising:
    an adjustment member formed of a cubically crystallized semiconductor material and having a groove formed therein, said groove having a V-shape and being formed by etched crystal faces of said semiconductor material;
    said mesa structure of said laser diode being received in said groove of said adjustment member with said etched surfaces of said laser diode being joined to said etched crystal faces of said groove; and
    said light transmitting fiber being received in said groove with said light transmitting core in registration with said laser active region of said laser diode.

* * * * *